United States Patent
Lionti et al.

(10) Patent No.: US 11,371,143 B2
(45) Date of Patent: Jun. 28, 2022

(54) IMPLEMENTING THE POST-POROSITY PLASMA PROTECTION (P4) PROCESS USING I-CVD

(71) Applicants: International Business Machines Corporation, Armonk, NY (US); Tokyo Electron Limited, Tokyo (JP)

(72) Inventors: Krystelle Lionti, San Jose, CA (US); Geraud Jean-Michel Dubois, Redwood City, CA (US); Willi Volksen, Alpine, UT (US); Jacques Faguet, Austin, TX (US)

(73) Assignees: International Business Machines Corporation, Armonk, NY (US); Tokyo Electron Limited, Tokyo (JP)

( * ) Notice: Subject to any disclaimer, the term of this patent is extended or adjusted under 35 U.S.C. 154(b) by 311 days.

(21) Appl. No.: 16/428,159

(22) Filed: May 31, 2019

(65) Prior Publication Data
US 2020/0378001 A1 Dec. 3, 2020

(51) Int. Cl.
*C23C 16/455* (2006.01)
*B05D 1/00* (2006.01)

(52) U.S. Cl.
CPC .............. *C23C 16/455* (2013.01); *B05D 1/60* (2013.01)

(58) Field of Classification Search
None
See application file for complete search history.

(56) References Cited

U.S. PATENT DOCUMENTS

| | | | |
|---|---|---|---|
| 8,314,005 B2 | 11/2012 | Purushothaman et al. | |
| 8,541,301 B2 | 9/2013 | Dubois et al. | |
| 9,058,983 B2 | 6/2015 | Dubois et al. | |
| 9,214,335 B2 | 12/2015 | Bruce et al. | |
| 9,492,805 B2 | 11/2016 | Gleason | |
| 9,508,549 B2 | 11/2016 | Park et al. | |
| 10,115,586 B2 | 10/2018 | Faguet et al. | |
| 2006/0070653 A1 | 4/2006 | Elrod et al. | |
| 2009/0087562 A1 | 4/2009 | Lee | |
| 2017/0037509 A1 | 2/2017 | Faguet et al. | |
| 2018/0277362 A1* | 9/2018 | Cho | H01L 23/5226 |

OTHER PUBLICATIONS

Claesson (Sensors and Actuators B 166-167 (2012) 526-534). (Year: 2012).*
Arratibel et al., Unravelling the transport mechanism of pore-filled membranes for hydrogen separation, Separation and Purification Technology 203:41-47 (2018).
(Continued)

*Primary Examiner* — Joel G Horning
(74) *Attorney, Agent, or Firm* — Karen Canaan; CanaanLaw, P.C.

(57) ABSTRACT

Provided is a pore-filling method for protecting the pores of a porous material. The method, which is performed using a modified i-CVD technique, involves filling the pores of a porous material with a gas phase monomer within a pressure chamber and subsequently polymerizing the monomer, both within the pores and on the surface of the material as an overburden. The method is solvent-free and can fill and protect pores of any size of any material.

41 Claims, 9 Drawing Sheets

(56) References Cited

OTHER PUBLICATIONS

Ichiki et al., Feasibility study into the deposition of an organic planarization layer using sequential polymerization initiated chemical vapor deposition, Thin Solid Films 635:23-26 (2017).
Lau et al.. Initiated Chemical Vapor Deposition (iCVD) of Poly(alkyl acrylates): An Experimental Study, Macromolecules 39(10):3688-3694 (2006).
Mao, Initiated Chemical Vapor Deposition of Functional Polyacrylic Thin Films, PhD Thesis for the Massachusetts Institute of Technology, 2005.
Nejati et al.. Pore Filling of Nanostructured Electrodes in Dye Sensitized Solar Cells by Initiated Chemical Vapor Deposition, Nano Letters 11:419-423 (2011).
Yasaka, X-ray thin-film measurement techniques: X-ray reflectivity measurement, The Rigaku Journal 26(2):1-9 (2010).

* cited by examiner

IMPLEMENTING THE POST-POROSITY PLASMA PROTECTION (P4) PROCESS USING I-CVD

JOINT RESEARCH AGREEMENT

The subject matter of this disclosure describes activities undertaken within the scope of a joint research agreement that was in place before the effective date of the instant application. The parties to the joint research agreement are International Business Machines Corporation (Armonk, N.Y., USA) and Tokyo Electron Limited (Minato-ku, Tokyo, Japan).

TECHNICAL FIELD

The embodiments described herein relate generally to pore-filling and more specifically to a method for filling the pores of a substrate using a modified i-CVD technique.

BACKGROUND OF THE INVENTION

Post Porosity Plasma Protection (P4) is a process by which a protective polymer is applied to a porous material to shield the pores of the material from processing steps that may be stressful or damaging to the porous material. The protection efficiency of the protective polymer is directly proportional to the overall pore fill level; hence, for maximum protection, even the smallest pores (which are generally the most challenging to infuse) should ideally be completely filled.

Currently, there are three main processes reported in the literature for implementing pore-filling with a protective polymer in porous, thin films. First, there is the P4 process, a liquid based method where a protective polymer is first dissolved in a solvent, then spun on the surface of a porous material, and finally infused into the pores of the porous material through capillary action upon heating of the entire system. Second, there is the in-situ P4 process, another liquid-based method, where the fill material is a monomer or a low molecular weight oligomer dissolved in a solvent (as opposed to a polymer in the case of traditional P4), in which polymerization occurs within the pores of the porous material. Third, there is the cryo-P4 process, where the pores of the porous material are infused with a fill material that is a liquid or a gas at room temperature, and subsequent to the filling, the liquid/gas fill material is converted to a solid at a cryogenic temperature.

The three aforementioned processes involve non-ideal requirements and/or characteristics. For example, the P4 and in-situ P4 processes are wet processes that can be detrimental in some applications, including applications relating to microelectronics. More particularly, the P4 process requires the use of polymers; however, polymeric chains typically have molecular weights that are too high to be applied to porous materials with small pores. While the in-situ P4 process uses molecules or oligomeric chains that are theoretically compatible with small pores, the molecules and oligomeric chains used in this process are volatile in practice, thus making the in-situ P4 process inefficient for achieving high filling levels in numerous pore sizes. The cryo-P4 process requires that both the protection steps and the processing steps are carried out at cryogenic temperatures, requiring tooling and materials having satisfactory cryogenic properties.

Based upon the foregoing limitations, there remains a need in the art for an alternative P4 process that can be applied to porous materials having a wide range of pore sizes and that is capable of being safely implemented without the need for specialized tools or materials.

SUMMARY OF THE INVENTION

The embodiments described herein overcome the need in the art with a new P4 process that is carried out without a solvent in a pressure chamber using a modified i-CVD technique.

In one embodiment, the present invention relates to a method comprising: placing a porous material into a pressure chamber; introducing a monomer in a constant gas flow into the pressure chamber, wherein the monomer is adsorbed (i) within pores of the porous material and (ii) on a surface of the porous material; stabilizing adsorption of the monomer by adjusting influx of the monomer until the monomer adsorbed on the surface of the porous material is at a constant thickness; and introducing a polymerization initiator in a constant gas flow into the pressure chamber, wherein the polymerization initiator is activated within the pressure chamber and the monomer on the surface of the porous material is polymerized together with the monomer within the pores of the porous material.

In another embodiment, the present invention relates to a method for use with a porous material in a low-pressure chamber that admits a gas flow having a monomer, the method comprising: introducing the gas flow into the chamber, thereby promoting adsorption of the monomer both (i) within the pores and (ii) at the surface of the porous material, so that an overburden of the monomer is formed on the surface of the porous material; adjusting the monomer partial pressure within the chamber, so that the thickness of the overburden on the surface of the porous material is kept substantially constant; then introducing an initiator into the chamber, whereupon the initiator is activated; and polymerizing the monomer with the activated initiator, so that substantially all of the overburden is polymerized.

In a further embodiment, the present invention relates to a method comprising: placing a porous material into a pressure chamber; introducing a gas flow comprising a monomer into the pressure chamber; promoting adsorption of the monomer (i) within pores of the porous material, and (ii) on a surface of the porous material, wherein an overburden of the monomer is formed on the surface of the porous material; adjusting partial pressure of the monomer influx within the pressure chamber, wherein the overburden of the monomer on the surface of the porous material is at a constant thickness; introducing a polymerization initiator into the pressure chamber, wherein the initiator is activated within the pressure chamber; and polymerizing the monomer with the activated polymerization initiator, wherein the overburden is polymerized together with the monomer within the pores of the porous material.

In another embodiment, the present invention relates to a method comprising: placing a porous material comprising a quartz crystal resonator (QCR) into a pressure chamber, wherein oscillation frequency of the QCR is measured with a quartz crystal microbalance (QCM); introducing a monomer into the pressure chamber in a constant gas flow, wherein the monomer is adsorbed (i) within pores of the porous material and (ii) on a surface of the porous material; stabilizing adsorption of the monomer by adjusting influx of the monomer until oscillation frequency of the QCR as measured by the QCM is close to constant and overburden of the monomer adsorbed on the surface of the porous material is at a constant thickness; and introducing a polymerization initiator into the pressure chamber in a constant gas flow, wherein the polymerization initiator is activated within the pressure chamber and the monomer on the surface of the porous material is polymerized together with the monomer within the pores of the porous material.

In a further embodiment, the pressure chamber and/or the low-pressure chamber is under vacuum or partial vacuum.

In another embodiment, the polymerization initiator is activated through thermal decomposition.

In a further embodiment, the pressure chamber comprises heated filaments and the thermal decomposition is caused by heat emitted from the heated filaments.

In another embodiment, the temperature of the porous substrate is selected to promote adsorption of the monomer.

In another embodiment, the polymerization initiator is an organic peroxide, an inorganic peroxide, and/or an aliphatic azo compound.

In a further embodiment, the polymerization initiator is tert-butyl peroxide.

In another embodiment, the porous material is selected from the group consisting of porous silicon, porous gallium nitride, porous silicon carbide, porous graphene, and combinations thereof.

In a further embodiment, the porous material is a porous organosilicate.

In another embodiment, the porous material is an organosilicate matrix spun deposited on a QCR substrate.

In a further embodiment, the temperature of the porous material is selected to promote adsorption of the monomer.

In another embodiment, the monomer is selected from the group consisting of lactones, butyrolactones, valerolactones, caprolactones, lactide, acrylates, methacrylates, and styrenes.

In a further embodiment, the monomer is neo-pentyl methacrylate.

In a further embodiment, the gas flow comprises an inert gas.

In another embodiment, the inert gas is selected from the group consisting of argon, helium, neon, xenon, and combinations thereof.

In a further embodiment, the inert gas is argon.

In another embodiment, the gas flow is a constant gas flow.

In a further embodiment, the monomer adsorption occurs for a period of 400-1500 seconds.

In another embodiment, the monomer adsorption stabilization, or monomer partial pressure adjustment, is maintained for a period of 30-600 seconds.

In a further embodiment, the polymerization initiator is introduced into the chamber for a period of 750-2000 seconds.

Additional aspects and embodiments of the invention will be provided, without limitation, in the detailed description of the invention that is set forth below.

DETAILED DESCRIPTION OF THE INVENTION

Set forth below is a description of what are currently believed to be preferred embodiments of the claimed invention. Any alternates or modifications in function, purpose, or structure are intended to be covered by the claims of this application. As used in this specification and the appended claims, the singular forms "a," "an," and "the" include plural referents unless the context clearly dictates otherwise. The terms "comprises" and/or "comprising," as used in this specification and the appended claims, specify the presence of stated features, integers, steps, operations, elements, and/or components, but do not preclude the presence or addition of one or more other features, integers, steps, operations, elements, components, and/or groups thereof.

As used herein, the term "QCR" stands for a "quartz crystal resonator." A QCR is an electronic oscillator circuit that uses the mechanical resonance of a vibrating piezoelectric material (i.e., a quartz crystal) to create an electrical signal with a precise frequency. When voltage is applied to an electrode near or on the crystal, the crystal oscillates as it becomes distorted by the electric field generated by the voltage, and the frequency of the oscillation can be measured. Similarly, when the electric field is removed from the range of the crystal, the crystal will also oscillate as it returns to its original position and the frequency of the return oscillation can also be measured.

Figure 1A:
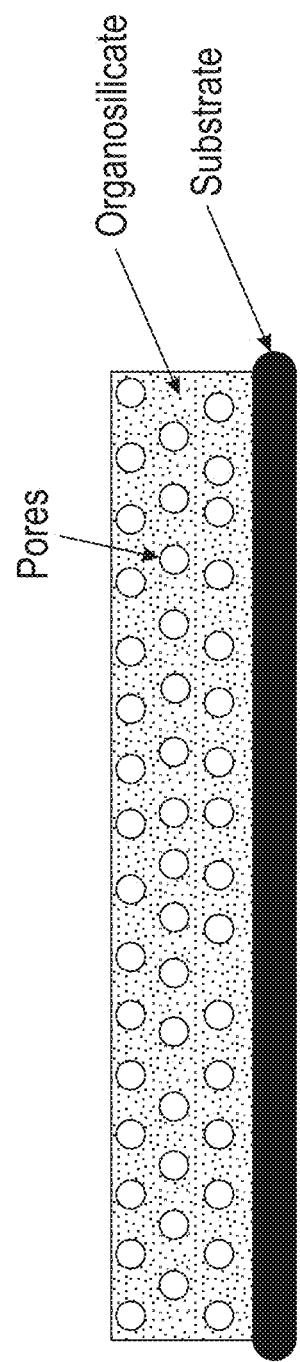
FIG. 1A is a cross-sectional diagram of a porous organosilicate matrix spun-deposited on a substrate.

As used herein, a "QCR substrate" is meant to refer to QCR that is coated with a thin polymer film. With reference to FIG. 1A, with a QCR substrate, the QCR would replace the silicon wafer and the porous organosilicate matrix would be coated on a surface of the QCR. It is to be understood that within the context of the embodiments disclosed herein, the terms "porous substrate," "porous material," and "porous film," are all meant to refer, as appropriate, to a porous substance that is being treated with the modified pore-filling and pore-protection procedures described herein, and as such, the terms may be used interchangeably herein. In a similar vein, the terms "substrate," "material," and "film" may also be used interchangeably herein.

As used herein, the term "QCM" stands for a "quartz crystal microbalance." A QCM is a device that measures mass variation per unit area of a QCR substrate by measuring the change in frequency of the quartz crystal of the QCR. When a QCM is applied to a QCR substrate, the resonance of the quartz crystal is disturbed by the addition or removal of a small mass due to oxide growth/decay of film deposition at the surface of the quartz crystal. An increase in mass will result in a decrease in the resonance frequency of the quartz crystal while a decrease in mass will result in an increase in the resonance frequency of the quartz crystal. A QCM can be used under vacuum, in gas phase, or in liquid environments.

Within the context of the embodiments described herein, application of QCM to a QCR substrate allows for monitoring of monomer adsorption and desorption in porous thin films. Where the film is porous and a monomer is being used for pore-filling, application of QCM to the porous QCR substrate allows for the tracking of monomer adsorption (where increase in mass is measured by a decrease in frequency of the QCR) and desorption (where a decrease in mass is measured by an increase in frequency of the QCR) because a change in frequency of the porous QCR substrate can be correlated to mass variation per unit area.

As used herein, the term "XRR" stands for "x-ray reflectivity." XRR is a surface-sensitive x-ray scattering technique used to characterize surfaces, such as thin films and multilayers. With XRR, a beam of x-rays is directed to a flat surface. As the x-rays are reflected off of the surface, the intensity of the reflected x-ray beams is measured in a specular direction (i.e., the reflected angle equal to the incident angle). If the interface between the x-rays and the surface is not perfectly sharp and smooth, the reflected intensity will deviate from that predicted by the laws of reflectivity. The deviations (i.e., scans) are analyzed to obtain the density profile of the interface normal to the surface (i.e., fits).

Within the context of the embodiments described herein, application of XRR to QCR substrates before and after pore-filling can be used to quantify pore fill level and assess pore homogeneity.

As used herein, the term "i-CVD" stands for stands for "initiated-chemical vapor deposition," which is a technique that is used on thin polymer films on any kind of non-porous substrate. I-CVD techniques involve introducing both a monomer and an initiator in a vapor-phase in a pressure chamber and activating the initiator by thermal decomposition (through for example, heated filaments) such that the initiator breaks down into radicals and initiates a free-radical polymerization of the monomer on the substrate surface. Examples 2 and 3 show that pore filling is not achievable using the conventional i-CVD techniques currently used in the art.

Figure 2:
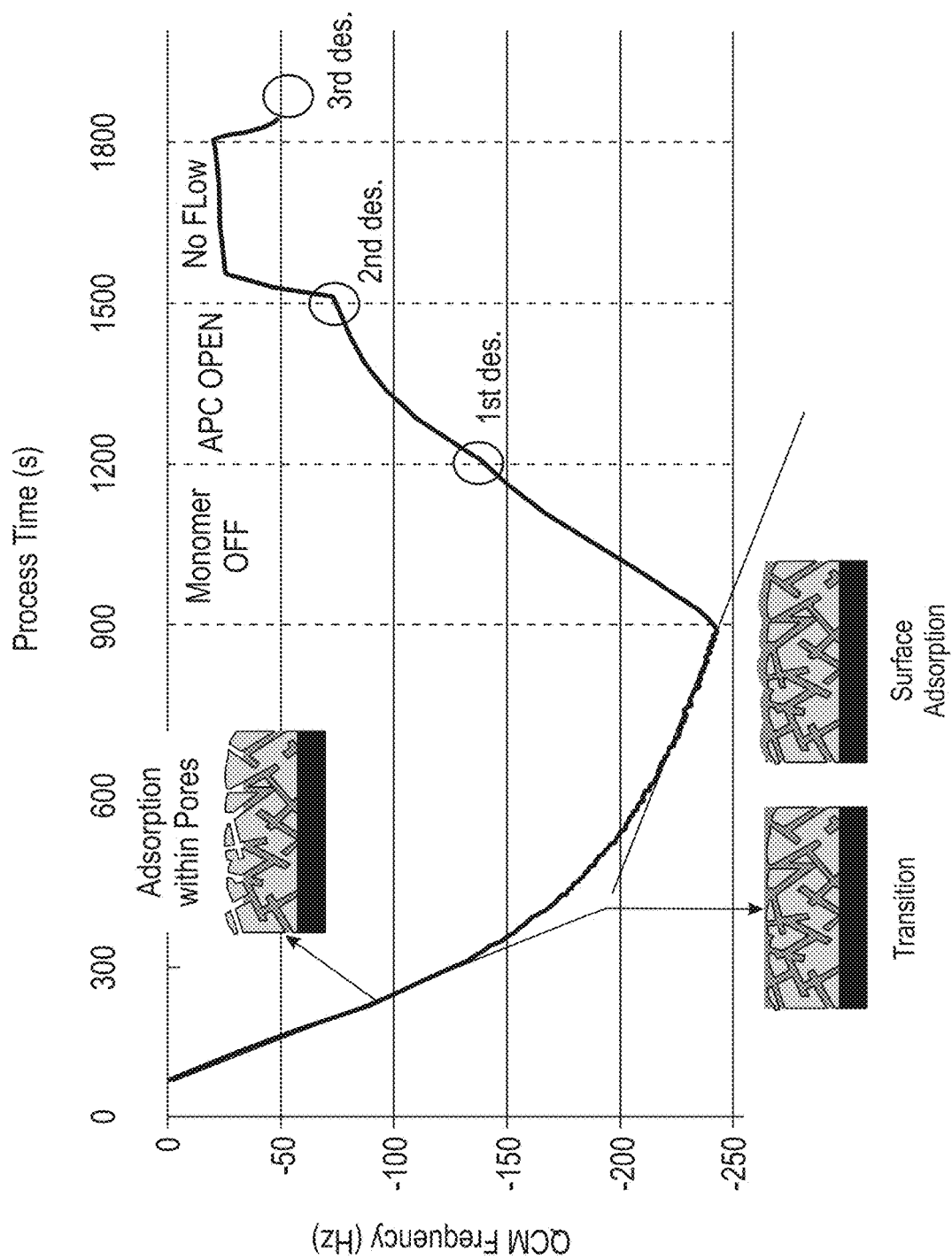
FIG. 2 is a graph showing QCM frequency as a function of process time for the conventional i-CVD pore-filling procedure of Example 2.

FIG. 2 shows the results of QCM frequency measurements as a function of the processing times using the conventional i-CVD technique described in Example 2. Example 2 is a testing procedure to establish that the polymerization process described in Example 1 resulted in the incorporation of the monomer in the pores of the substrate. As shown in FIG. 2, during the first 900 sec, the QCM frequency varied in a monotonic fashion suggesting that the monomer was deposited on the porous film. The transition phase between the steep slope between 0-300 sec and the gentler slope after 600 sec is attributed to a change in the adsorption rate, which corresponds to a transition from monomer adsorption within the pores of the organosilicate film to surface adsorption, thus indicating that pore adsorption of the organosilicate film was complete and that monomer overburden was building up on the surface of the organosilicate film.

After 900 sec, the cessation of the incoming monomer flow led to an inflexion point in the QCM frequency. The increase in the QCM frequency was the result of the monomer escaping the pores of the organosilicate film (because no monomer polymerization step was implemented). The subsequent increase in the chamber pressure back to atmospheric pressure at t=1200 sec and the cessation of the argon flow at t=1500 sec resulted in a continued increase in the QCM frequency until the QCM had returned to its initial value, indicating that the pores had emptied.

With reference to the argon flow, it is to be understood that other suitable inert gases may be used to carry out the gas flow into the pressure chamber. Examples of such inert gases include the noble gases including, without limitation, helium, neon, and xenon.

Figure 3:
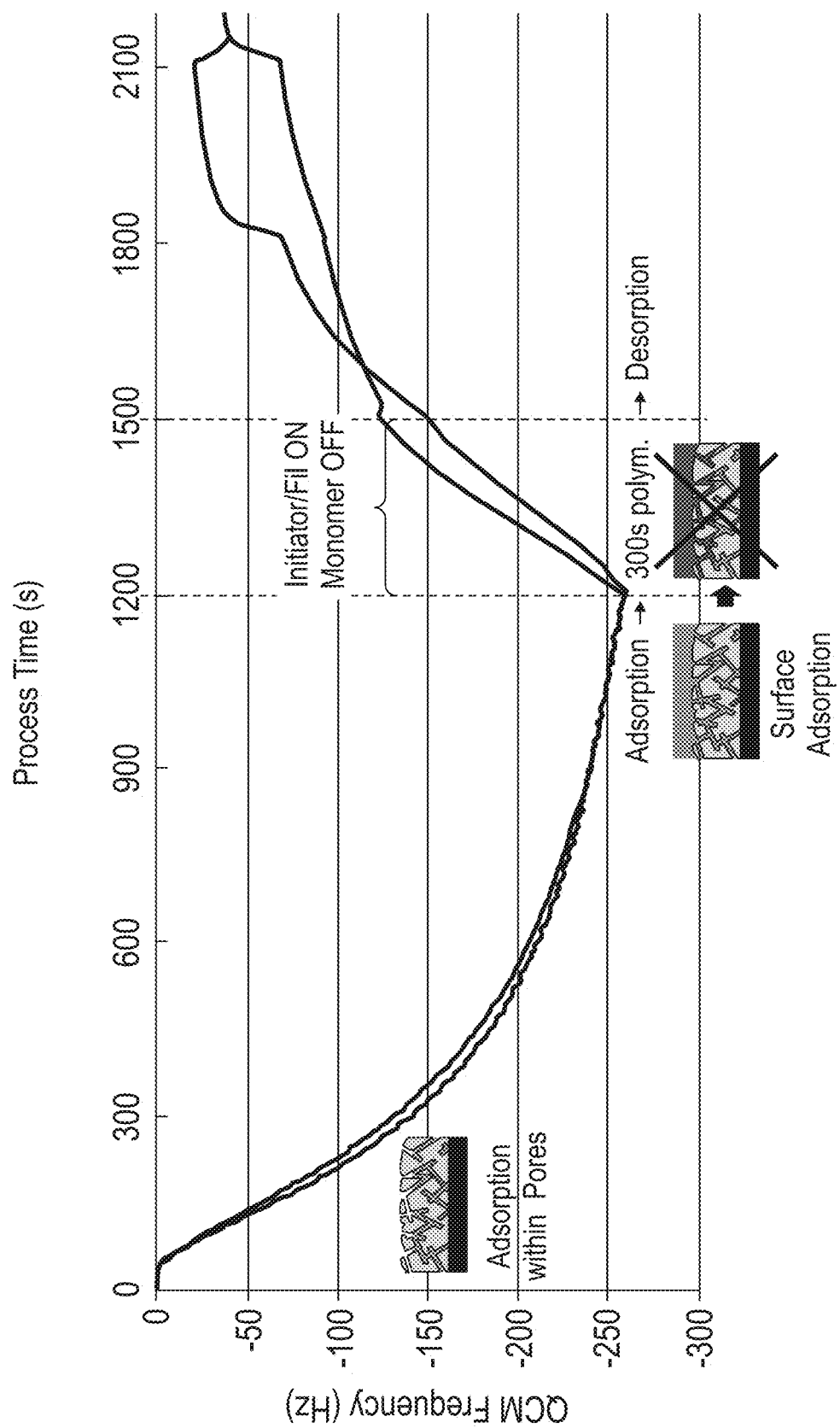
FIG. 3 is a graph showing QCM frequency as a function of process time for the conventional i-CVD pore-filling procedure of Example 3.

FIG. 3 shows the results of two separate QCM frequency measurements (conducted twice on the same film) as a function of the processing times using the conventional i-CVD technique described in Example 3. For the first 1200 sec, the two separate trace lines of FIG. 3 match the t=1-900 sec trace line of FIG. 2, indicating that the pores of the film had fully filled with the monomer. At t=1200 sec, despite the introduction and activation of the initiator, the QCM frequency increased, similar to what was seen at t=900 sec in FIG. 2, suggesting that the monomer was able to escape the pores of the film because it was still in volatile form and not polymerized within the pores of the film. The QCM frequency continued to increase as the chamber was brought back to atmospheric pressure (at t=1500 sec) and the argon flow was shut off (at t=1800 sec). After t=1800 sec, the QCM frequency recovered its initial value indicating that the pores had emptied.

The results of Examples 2 and 3 demonstrate that conventional i-CVD techniques fail to protect the filler within a porous material, because as soon as the filler supply stops, the filler starts to dissipate from the pores and fully disappears when the porous material is brought back to atmospheric pressure and room temperature. Conventional i-CVD techniques are consequently not suitable P4 processes.

Figure 6:
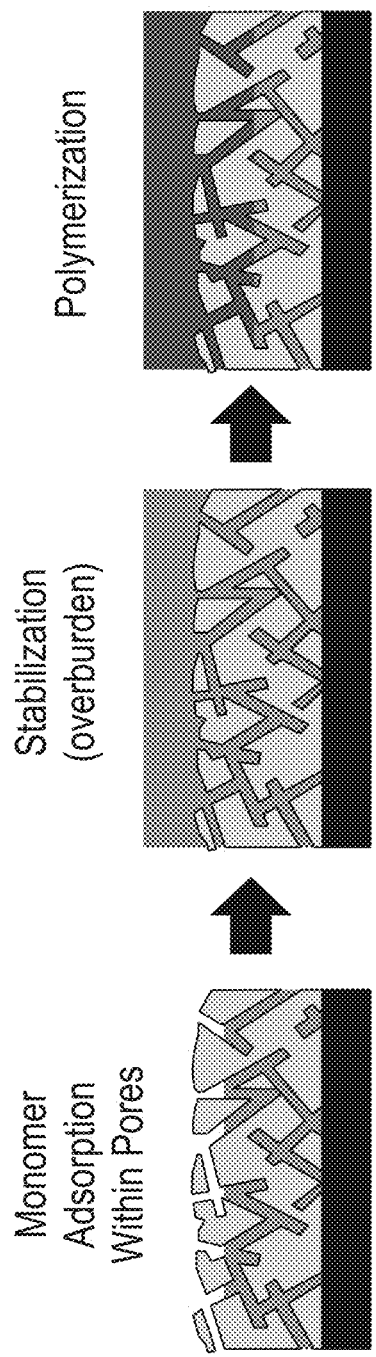
FIG. 6 is a schematic illustration showing the steps required to enable pore-filling using the modified i-CVD pore-filling procedure described herein.

FIG. 6 is a schematic representation of the modified i-CVD pore filling procedure described herein, which is carried out under constant gas flow in a pressure chamber. As shown in FIG. 6, the process first comprises adsorption of the monomer into the pores of the substrate (without an initiator). The monomer adsorption is a bottom up step such that the monomer adsorption starts at the bottom of the pore and progresses to the top of the pore. The process next comprises monomer adsorption stabilization through formation of a monomer overburden on the top of the porous material (the overburden should have a constant thickness atop the surface of the porous material). Monomer stabilization is implemented by adjusting the partial pressure influx of the monomer into the pressure chamber. Lastly, the process comprises monomer polymerization within the pores of the substrate.

In one embodiment, introduction of an initiator occurs after the monomer adsorption is stabilized. In another embodiment, the monomer polymerization may occur for as long as necessary to sufficiently polymerize the overburden and obtain a thermally stable polymer within in the pores of the substrate.

In a further embodiment, the monomer adsorption occurs for a period of about 400 to about 1500 seconds. In another embodiment, the monomer adsorption stabilization, or monomer partial pressure adjustment, is maintained for a period of about 30 to about 600 seconds. In a further embodiment, the polymerization initiator is introduced into the chamber for a period of about 750 to about 2000 seconds.

Examples of initiators that may be used with the modified i-CVD technique described herein include any initiators that produce free radicals that can form an intermediate compound capable of linking successively with a large number of other monomers into a polymeric compound. Polymerization initiators are included in the broad categories of peroxides (organic and inorganic) and aliphatic azo compounds. Examples of polymerization initiators that may be used with the modified i-CVD technique described herein include without limitation, methyl methacrylate; triethyl amine; tert-butyl peroxide; tert-butyl peracetate; benzoyl peroxide; cumene hydroperoxide; 2-butanone peroxide; lauroyl peroxide; tert-butyl peroxybenzoate; tert-butylperoxy 2 ethylhexyl carbonate; tert-butyl hydroperoxide; 2,5-di(tert-butylperoxyl)-2,5,-dimethyl-3-hexyne; dicumyl peroxide; 2,5-bis(tert-butylperoxyl)-2,5,-dimethylhexane; 2,4-pentanedione peroxide; 1,1-bis(tert-butylperoxy)-3,3,5-trimethylcyclohexane; 1,1-bis(tert-amylperoxy)cyclohexane; boron trifluoride; triethylaluminum; titanium tetrachloride; ammonium persulfate; hydroxymethanesulfinic acid; potassium persulfate; sodium persulfate; and azobisisibutyronitrile; 4-4'-azobis(4-cyanovaleric acid); 1,1'-azobis(cyclohexanecarbonitrile); 2,2'-azobis(2-methylpropionitrile); and 2,2'-azobis (2-methylpropionitrile).

The ability of the modified i-CVD technique described herein to protect the filled pores on the substrate confirms that it can serve as a new P4 process. Examples 4 and 5 show successful pore-filling and pore-protection using the modified i-CVD technique, which is capable of filling pores of any size on any suitable porous material.

Figure 4:
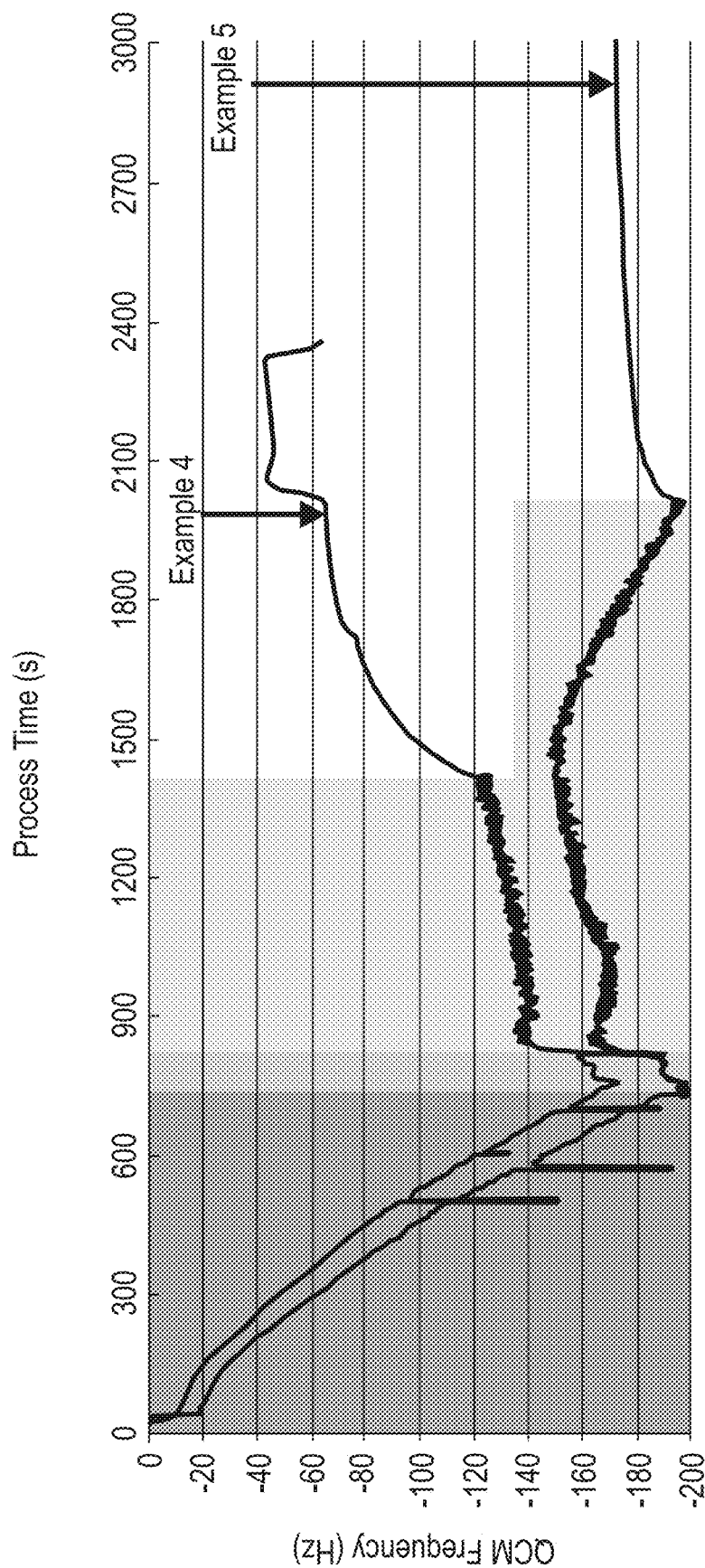
FIG. 4 is a graph showing QCM frequency as a function of process time for the modified i-CVD pore-filling procedure of Examples 4 and 5.

FIG. 4 shows the results of two separate QCM frequency measurements (conducted on two separate films) as a function of the processing times described in Examples 4 and 5. The modified i-CVD technique described herein and in Examples 4 and 5 is unlike the conventional i-CVD techniques described in Examples 2 and 3 because under the modified i-CVD technique, monomer flow does not stop once the pores are filled and the overburden has started to build-up on the porous film's surface. In addition to maintaining the gaseous monomer flow through polymerization, the modified i-CVD technique also includes a stabilization step, which is implemented through partial pressure adjustment.

With reference to the Example 4 data in FIG. 4 (top data line), at t=750 sec, after the pores of the film were filled with the monomer and the overburden had started to build up on the surface of the porous film, the partial pressure of the influx of the monomer ($P_M/P_{sat}$) was adjusted until the QCM frequency was constant (this occurred between 750-850 sec). The adjustment resulted in the adsorption and desorption of the monomer occurring at a similar rate so that the monomer's overburden thickness at the surface of the film became constant. At t=850 sec, following the overburden stabilization and while the monomer influx was continuing, the polymerization initiator was introduced in the chamber through the heated filaments for 600 sec (850-1450 sec). At this step, the QCM frequency remained close to constant. At t=1450 sec, both the argon flow and the monomer influx were stopped and the pressure of the chamber was brought back to atmospheric pressure. At this point, the QCM frequency increased, but did not completely recover its initial value (FIG. 4, arrow) indicating that some, but not all, of the monomer had polymerized in the pores of the film. The unpolymerized monomer desorbed from the film's pores as the chamber was opened.

Figure 5A:
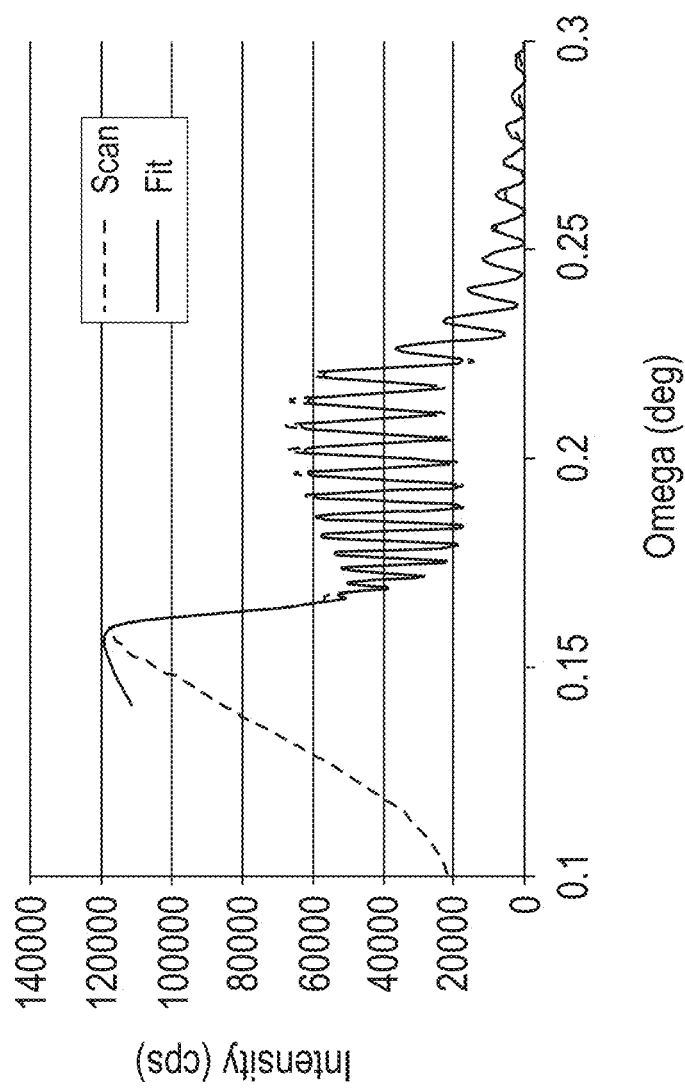
FIG. 5A is a graph showing XRR fits and scans at the start of the modified i-CVD pore-filling procedure (t=0 sec) of Example 5.
Figure 5B:
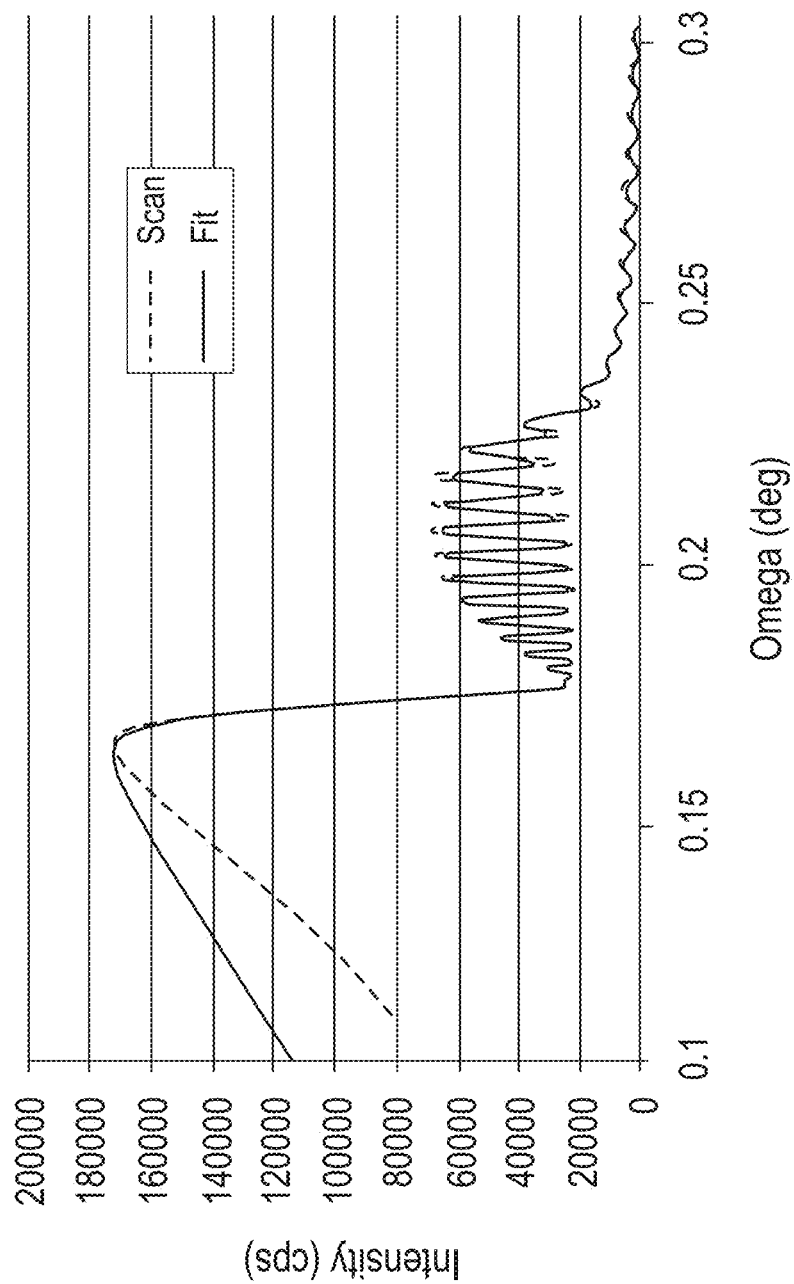
FIG. 5B is a graph showing XRR fits and scans at the end of the modified i-CVD pore-filling procedure (t=3000 sec) of Example 5.

Example 5 optimized the procedure of Example 4 by extending the influx of polymerization initiator from 600 sec to 1200 sec. With reference to the Example 5 data in FIG. 4 (bottom data line), the QCM measurements at t=0-1450 were similar to those seen for Example 4. As the polymerization of the monomer extended beyond 1450 sec, the QCM frequency started to slowly decrease until the initiator flow was turned off at t=2050 sec. The decrease in frequency was related to the polymerization of the monomer within the pores as well as the polymerization of the overburden on the surface of the film. After the polymerization step, when the chamber was brought back to atmospheric pressure and the monomer, initiator, and argon flow were stopped, the QCM frequency did not change and remained low indicating that minimal monomer desorption had occurred and that the pores of the film had remained protected by the polymerization monomer. FIG. 5A shows the scans and fits of an XRR run on the porous film of Example 5 before the initiation of the modified i-CVD technique at t=0, and FIG. 5B shows the scans and fits of the XRR run on the porous film of Example 5 after completion of the modified i-CVD technique at t=3000 sec. That the porous bulk was able to be fitted using one layer of monomer (as described in Examples 4 and 5) shows that the filler occupied the pores of the substrate in a homogeneous way throughout the entire film thickness. Table 1 shows the measurements of the porous bulk at t=0 sec based upon the scan and fit graph of FIG. 5A, and Table 2 shows the measurements of the polymer overburden and porous bulk at t=3000 sec based upon the scan and fit graph of FIG. 5B.

TABLE 1

|  | t (nm) | $\varrho$ (g/cm$^3$) |
|---|---|---|
| Porous Bulk | 446.8 | 1.186 |

TABLE 2

|  | t (nm) | $\varrho$ (g/cm$^3$) |
|---|---|---|
| Polymer Overburden | 36.5 | 1.053 |
| Porous Bulk | 451.0 | 1.324 |

The fill level of the substrate can be calculated using the following equation:

$$(\varrho_{filled} - \varrho_{empty})/(\varrho_{polym} \times V_p) = \text{fill level (\%)}$$

where, $\varrho_{empty}$=density of empty bulk, in g/cm3;

$\varrho_{filled}$=density of filled bulk, in g/cm3;

$\varrho_{polym}$=density of fill polymer, in g/cm3; and $V_p$=porous volume fraction of empty bulk (percentage).

As shown in Tables 1 and 2, the porous bulk density of the substrate increased from 1.186 g/cm$^3$ to 1.324 g/cm$^3$. When these values are applied to the fill level equation, the substrate is found to have a fill level of 63.6%:

$$(1.324-1.186)/(1.053 \times 0.206) = 63.6\%$$

It is to be understood that the porous QCR substrate described herein was used for purposes of illustration of the effectiveness of the modified i-CVD technique and that the i-CVD technique is not limited to application on porous QCR substrates. Examples of suitable porous substrates that may be used with the modified i-CVD technique include, without limitation, porous silicon, porous gallium nitride, porous silicon carbide, or porous graphene.

The modified i-CVD technique described herein has utility in a number of applications, most notably, it can be used in any existing application where P4 processes are required. For example, protection of porosity is needed during semiconductor patterning techniques where low-k materials are required. The technique can also be used to prepare membranes with adjustable pore sizes and pore chemistry, which has application for the separation of biological molecules. The technique can further be used to prepare nanocomposites with adjustable mechanical, electrical, and thermal properties.

Any monomer that is used in P4 process can be used with the i-CVD technique described herein. Examples of such monomers include, without limitation, lactones, butyrolactones, valerolactones, caprolactones, lactide, acrylates, methacrylates, and styrenes.

It is to be understood that while the invention has been described in conjunction with the embodiments set forth above, the foregoing description as well as the examples that follow are intended to illustrate and not limit the scope of the invention. Further, it is to be understood that the embodiments and examples set forth herein are not exhaustive and that modifications and variations of the invention will be apparent to those of ordinary skill in the art without departing from the scope and spirit of the invention.

EXPERIMENTAL

The following examples are set forth to provide those of ordinary skill in the art with a complete disclosure of how to make and use the aspects and embodiments of the invention as set forth herein. While efforts have been made to ensure accuracy with respect to variables such as amounts, temperature, etc., experimental error and deviations should be taken into account. Unless indicated otherwise, parts are parts by weight, temperature is degrees centigrade, and pressure is at or near atmospheric. All components were obtained commercially unless otherwise indicated.

Example 1

Figure 1B:
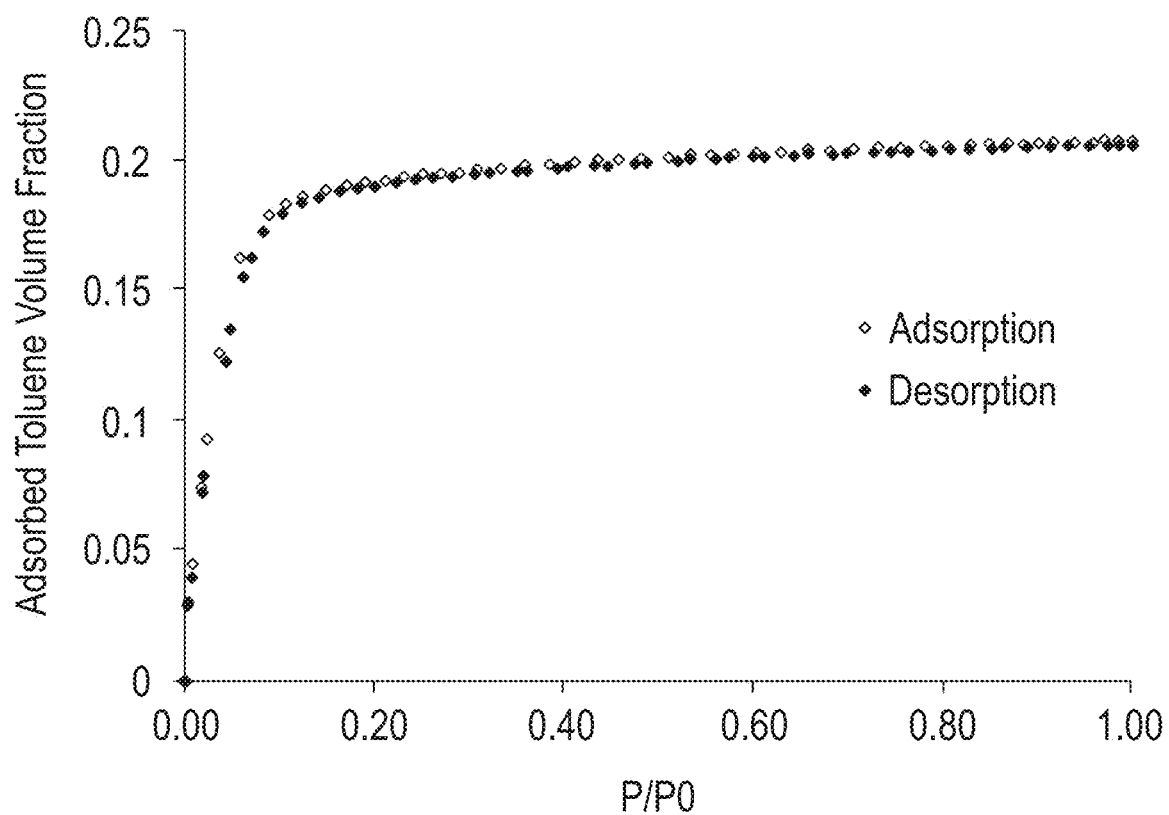
FIG. 1B is a graph showing toluene-based adsorption/desorption ellipsometric porosimetry data of the porous organosilicate film according to FIG. 1A.
Figure 1C:
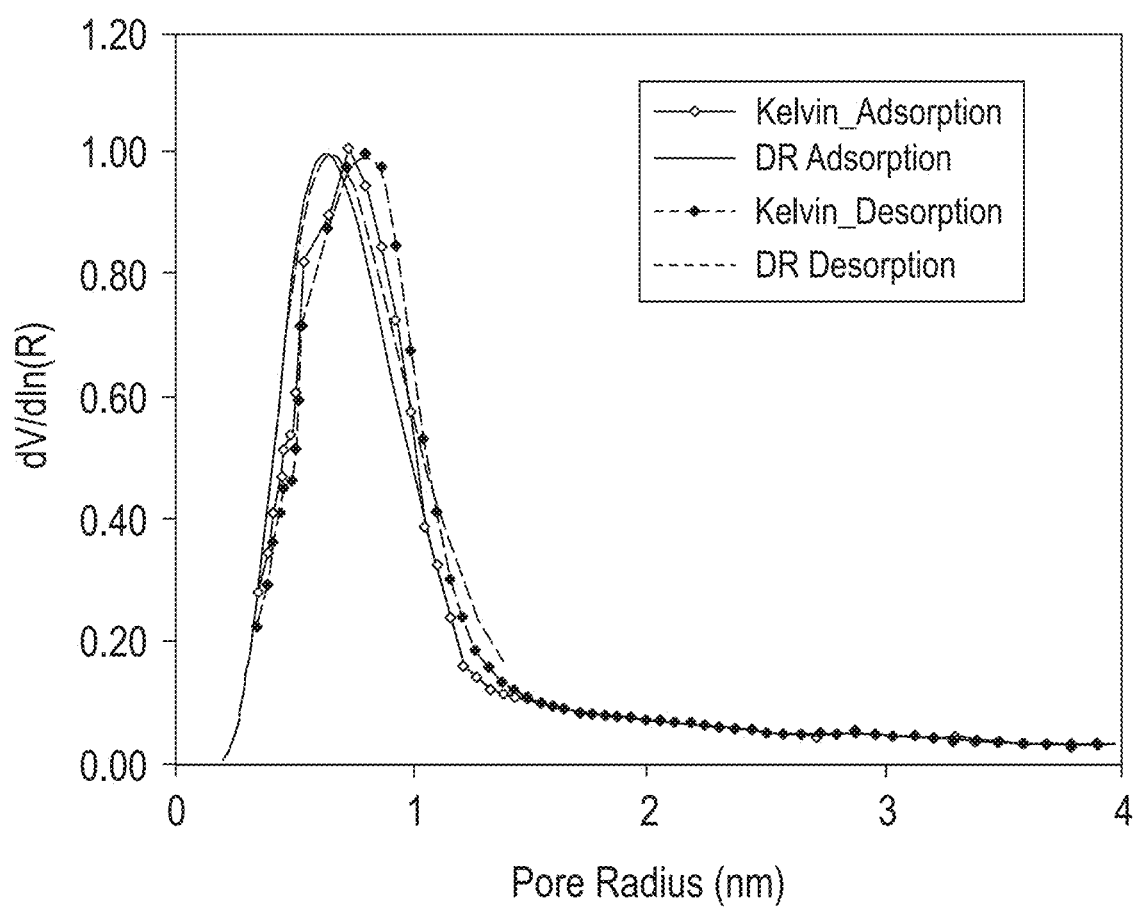
FIG. 1C is a graph showing the pore size distribution of the porous organosilicate film according to FIG. 1A.

Measuring Pore Volume and Pore Size Distribution of a Porous Organosilicate Film A porous organosilicate matrix was spun-deposited on a silicon wafer substrate (FIG. 1A) and the porosity of the resulting porous film was characterized with toluene-based ellipsometric porosimetry (FIGS. 1B and 1C). As shown in FIG. 1B, the adsorption and desorption isotherms indicate a total porous volume fraction of 20.6%. As shown in FIG. 1C, the organosilicate film was measured to have an average pore diameter of 1.3 nm and a narrow pore size distribution. In FIG. 1C, the abscissa corresponding to the maximum of the gaussian represents the average pore size. This organosilicate matrix was used in the following examples.

Example 2

Testing Pore Filling with Conventional I-CVD

The porous organosilicate matrix of Example 1 was spun-deposited on a QCR substrate and the resulting porous QCR substrate was placed in a pressure chamber on a cooled stage kept at 5° C. Within the chamber, the porous QCR substrate was subjected to the following conditions at the following time periods while the change in QCM frequency of the QCR was monitored over time (FIG. 2).

0-900 sec: A t=0 sec, the gaseous monomer neo-pentyl methacrylate (nPMA) was introduced into the pressure chamber in a constant argon flow under vacuum.

900-1200 sec: At t=900 sec, while still under argon flow and under vacuum (and after the monomer was adsorbed in the pores of the QCR substrate and an overburden had formed on the surface of the film), the influx of monomer was stopped.

1200-1500 sec: At t=1200 sec, while still under argon flow, the pressure chamber was opened resulting in the pressure within the chamber returning to atmospheric pressure.

1500-1800 sec: At t=1500 sec, the argon flow was stopped.

Result: All of the monomer had dissipated from the pores at t=1800 sec.

Example 3

Measuring Pore Filling with Conventional I-CVD using a Polymerization Initiator

This experiment added a polymerization initiator to the i-CVD procedure of Example 2. The porous organosilicate matrix of Example 1 was spun-deposited on a QCR substrate and the resulting porous QCR substrate was placed in a pressure chamber on a cooled stage kept at 5° C. The pressure chamber in this experiment included filaments that could be heated, the heat being required to activate the polymerization initiator. Within the chamber, the porous QCR substrate was subjected to the following conditions at the following time periods while the change in QCM frequency of the QCR was monitored over time (FIG. 3) representing two separate measurements on the same specimen).

0-1200 sec: A t=0 sec, the gaseous monomer nPMA was introduced into the pressure chamber in a constant argon flow under vacuum.

1200-1500 sec: At t=1200 sec, while still under argon flow and under vacuum (and after the monomer was adsorbed in the pores of the QCR substrate and an overburden had formed on the surface of the film), the incoming monomer flow was turned off and at the same time, the initiator, tert-butyl peroxide, was introduced into the chamber through the heated filaments.

1500-1800 sec: At t=1500, while still under argon flow, the influx of the initiator was stopped and the pressure chamber was opened resulting in the pressure within the chamber returning to atmospheric pressure.

1800-2100 sec: At t=1800 sec, the argon flow was stopped.

Result: All of the monomer had dissipated from the pores by t=2100 sec.

Example 4

Measuring Pore Filling with Modified I-CVD

The porous organosilicate matrix of Example 1 was spun-deposited on a QCR substrate and the resulting porous QCR substrate was placed in a pressure chamber on a cooled stage kept at 5° C. The pressure chamber in this experiment included filaments that could be heated. Within the chamber, the porous QCR substrate was subjected to the following conditions at the following time periods while the change in QCM frequency of the QCR was monitored over time (FIG. 4, top data line).

0-750 sec: A t=0 sec, the gaseous monomer nPMA was introduced into the pressure chamber in a constant argon flow under vacuum.

750-850 sec: At t=750 sec, while still under the constant argon flow and under vacuum, and while the influx of the monomer was continuing, the partial pressure of the monomer influx was adjusted so that the QCM frequency was close to constant.

850-1450 sec: At t=850 sec, while still under argon flow and under vacuum, and while the influx of the monomer was continuing, the initiator, tert-butyl peroxide, was introduced into the chamber through the heated filaments.

1450-1700 sec: At t=1450, while still under argon flow, the influx of the initiator was stopped, the influx of monomer was stopped, and the pressure chamber was opened, resulting in the pressure within the chamber returning to atmospheric pressure.

1700-2050 sec: At t=1700 sec, the argon flow was stopped.

Result: Some, but not all, of the monomer remained in the pores at t=2050 sec.

Example 5

Measuring Pore Filling with Modified I-CVD with Optimized Polymerization

This experiment optimized the polymerization step of Example 4 by increasing the initiator flow from the 600 sec of Example 4 to 1200 sec. The porous organosilicate matrix of Example 1 was spun-deposited on a QCR substrate and the resulting porous QCR substrate was placed in a pressure chamber on a cooled stage kept at 5° C. The pressure chamber in this experiment included filaments that could be heated. Within the chamber, the porous QCR substrate was subjected to the following conditions at the following time periods while the change in QCM frequency of the QCR was monitored over time (FIG. 4, bottom data line).

0-750 sec: A t=0 sec, the gaseous monomer nPMA was introduced into the pressure chamber in a constant argon flow under vacuum.

750-850 sec: At t=750 sec, while still under the constant argon flow and under vacuum, and while the influx of the monomer was continuing, the partial pressure of the monomer influx was adjusted so that the QCM frequency was close to constant.

850-2050 sec: At t=850 sec, while still under argon flow and under vacuum, and while the influx of the monomer was continuing, the initiator, tert-butyl peroxide, was introduced into the chamber through the heated filaments.

2050-3000 sec: At t=2050, the influx of the initiator was stopped, the influx of monomer was stopped, the argon flow was stopped, and the pressure chamber was opened resulting in the pressure within the chamber returning to atmospheric pressure.

An XRR run on the porous QCR substrate at t=0 (FIG. 5A) prior to the initiation of the experiment and at t=3000 (FIG. 5B) confirmed that the pores of the film were filled upon completion of the modified i-CVD technique.

Result: The monomer did not dissipate from the pores at t=3000 sec.

We claim:

1. A method comprising:
   placing a porous material into a pressure chamber;
   introducing a monomer in a gas flow into the pressure chamber, wherein the monomer is adsorbed (i) within the entirety of the pores of the porous material and (ii) on a surface of the porous material;
   stabilizing adsorption of the monomer by adjusting influx of the monomer until the monomer adsorbed on the surface of the porous material is at a constant thickness; and
   introducing a polymerization initiator in a gas flow into the pressure chamber, wherein the polymerization initiator is activated within the pressure chamber, and the monomer on the surface of the porous material is polymerized together with the monomer within the entirety of the pores of the porous material.

2. The method of claim 1, wherein the polymerization initiator is activated through thermal decomposition.

3. The method of claim 2, wherein the pressure chamber has heated filaments therein, and the thermal decomposition is caused by heat emitted from the heated filaments.

4. The method of claim 1, wherein the temperature of the porous material is selected to promote said adsorption of the monomer.

5. The method of claim 1, wherein the polymerization initiator is an organic peroxide, an inorganic peroxide, and/or an aliphatic azo compound.

6. The method of claim 1, wherein the polymerization initiator is tert-butyl peroxide.

7. The method of claim 1, wherein the porous material is selected from the group consisting of porous silicon, porous gallium nitride, porous silicon carbide, porous graphene, and combinations thereof.

8. The method of claim 1, wherein the porous material is a porous organosilicate.

9. The method of claim 1, wherein the monomer is selected from the group consisting of lactones, butyrolactones, valerolactones, caprolactones, lactide, acrylates, methacrylates, and styrenes.

10. The method of claim 1, wherein the monomer is neo-pentyl methacrylate.

11. The method of claim 1, wherein the gas flow comprises an inert gas, wherein the inert gas is selected from the group consisting of argon, helium, neon, xenon, and combinations thereof.

12. The method of claim 1, wherein the monomer adsorption occurs for a period of 400-1500 seconds.

13. The method of claim 1, wherein the monomer adsorption stabilization is maintained for a period of 30-600 seconds.

14. The method of claim 1, wherein the polymerization initiator is introduced into the chamber for a period of 750-2000 seconds.

15. A method for use with a porous material in a low-pressure chamber that admits a gas flow having a monomer, the method comprising:
   introducing the gas flow into the chamber, thereby promoting adsorption of the monomer both (i) within the entirety of the pores and (ii) at the surface of the porous material, so that an overburden of the monomer is formed on the surface of the porous material;
   adjusting the monomer partial pressure within the chamber, so that the thickness of the overburden on the surface of the porous material is kept substantially constant; then introducing an initiator into the chamber, whereupon the initiator is activated; and
   polymerizing the monomer with the activated initiator, so that the monomer within the entirety of the pores is polymerized and substantially all of the overburden is polymerized.

16. The method of claim 15, wherein the initiator is activated through thermal decomposition.

17. The method of claim 16, wherein the thermal decomposition is caused by heated filaments located in the chamber.

18. The method of claim 15, wherein the temperature of the porous material is selected to promote said adsorption of the monomer.

19. The method of claim 15, wherein the initiator is an organic peroxide, an inorganic peroxide, and/or an aliphatic azo compound.

20. The method of claim 15, wherein the initiator is tert-butyl peroxide.

21. The method of claim 15, wherein the porous material is selected from the group consisting of porous silicon, porous gallium nitride, porous silicon carbide, porous graphene, and combinations thereof.

22. The method of claim 15, wherein the porous material is a porous organosilicate.

23. The method of claim 15, wherein the monomer is selected from the group consisting of lactones, butyrolactones, valerolactones, caprolactones, lactide, acrylates, methacrylates, and styrenes.

24. The method of claim 15, wherein the monomer is neo-pentyl methacrylate.

25. The method of claim 15, wherein the gas flow comprises an inert gas, wherein the inert gas is selected from the group consisting of argon, helium, neon, xenon, and combinations thereof.

26. The method of claim 15, wherein the monomer adsorption occurs fora period of 400-1500 seconds.

27. The method of claim 15, wherein the monomer partial pressure adjustment is maintained for a period of 30-600 seconds.

28. The method of claim 15, wherein the initiator is introduced into the chamber for a period of 750-2000 seconds.

29. A method comprising:
placing a porous material into a pressure chamber;
introducing a gas flow comprising a monomer into the pressure chamber;
promoting adsorption of the monomer (i) within the entirety of the pores of the porous material, and (ii) on a surface of the porous material, wherein an overburden of the monomer is formed on the surface of the porous material;
adjusting the partial pressure of the monomer within the pressure chamber, wherein the overburden of the monomer on the surface of the porous material has a thickness that is substantially constant;
introducing a polymerization initiator into the pressure chamber, wherein the initiator is activated within the pressure chamber; and
polymerizing the monomer with the activated polymerization initiator, wherein the overburden is polymerized together with the monomer within the entirety of the pores of the porous material.

30. The method of claim 29, wherein the pressure chamber has heated filaments therein, the polymerization initiator is activated through thermal decomposition, and the thermal decomposition is caused by heat emitted from the heated filaments.

31. The method of claim 29, wherein the temperature of the porous material is selected to promote said adsorption of the monomer.

32. The method of claim 29, wherein the monomer adsorption occurs fora period of 400-1500 seconds.

33. The method of claim 29, wherein the monomer partial pressure adjustment is maintained for a period of 30-600 seconds.

34. The method of claim 29, wherein the polymerization initiator is introduced into the chamber for a period of 750-2000 seconds.

35. A method comprising:
placing a porous material comprising a quartz crystal resonator (QCR) into a pressure chamber, wherein oscillation frequency of the QCR is measured with a quartz crystal microbalance (QCM);
introducing a monomer into the pressure chamber in a gas flow, wherein the monomer is adsorbed (i) within the entirety of the pores of the porous material and (ii) on a surface of the porous material;
stabilizing adsorption of the monomer by adjusting influx of the monomer until the oscillation frequency of the QCR as measured by the QCM is close to constant and overburden of the monomer adsorbed on the surface of the porous material has a thickness that is substantially constant; and
introducing a polymerization initiator into the pressure chamber in a gas flow, wherein the polymerization initiator is activated within the pressure chamber and the monomer on the surface of the porous material is polymerized together with the monomer within the entirety of the pores of the porous material.

36. The method of claim 35, wherein the pressure chamber has heated filaments therein, the polymerization initiator is activated through thermal decomposition, and the thermal decomposition is caused by heat emitted from the heated filaments.

37. The method of claim 35, wherein the temperature of the porous material is selected to promote said adsorption of the monomer.

38. The method of claim 35, wherein the porous material is an organosilicate matrix spun deposited on a QCR substrate.

39. The method of claim 35, wherein the monomer adsorption occurs fora period of 400-1500 seconds.

40. The method of claim 35, wherein the monomer adsorption stabilization is maintained for a period of 30-600 seconds.

41. The method of claim 35, wherein the polymerization initiator is introduced into the chamber for a period of 750-2000 seconds.

* * * * *